(12) United States Patent
Kang et al.

(10) Patent No.: US 10,804,373 B2
(45) Date of Patent: *Oct. 13, 2020

(54) METHOD FOR FORMING A LOW-K SPACER

(71) Applicant: Taiwan Semiconductor Manufacturing Co., Ltd., Hsinchu (TW)

(72) Inventors: Hsiu-Yu Kang, Taipei (TW); Hong-Wei Chen, Hsinchu (TW)

(73) Assignee: Taiwan Semiconductor Manufacturing Co., Ltd., Hsinchu (TW)

( * ) Notice: Subject to any disclaimer, the term of this patent is extended or adjusted under 35 U.S.C. 154(b) by 0 days.

This patent is subject to a terminal disclaimer.

(21) Appl. No.: 16/517,910

(22) Filed: Jul. 22, 2019

(65) Prior Publication Data

US 2019/0341466 A1 Nov. 7, 2019

Related U.S. Application Data

(63) Continuation of application No. 15/589,659, filed on May 8, 2017, now Pat. No. 10,361,282.

(51) Int. Cl.
| | |
|---|---|
| *H01L 29/66* | (2006.01) |
| *H01L 21/02* | (2006.01) |
| *H01L 21/3105* | (2006.01) |
| *H01L 29/40* | (2006.01) |

(52) U.S. Cl.
CPC ...... *H01L 29/6656* (2013.01); *H01L 21/0214* (2013.01); *H01L 21/0228* (2013.01); *H01L 21/0234* (2013.01); *H01L 21/02057* (2013.01); *H01L 21/02126* (2013.01); *H01L 21/02211* (2013.01); *H01L 21/02277* (2013.01); *H01L 21/02337* (2013.01); *H01L 21/3105* (2013.01); *H01L 29/401* (2013.01); *H01L 29/6653* (2013.01); *H01L 29/66545* (2013.01)

(58) Field of Classification Search
None
See application file for complete search history.

(56) References Cited

U.S. PATENT DOCUMENTS

| | | | | |
|---|---|---|---|---|
| 6,486,751 B1* | 11/2002 | Barber | ...... | H03H 3/02 29/25.35 |
| 10,361,282 B2* | 7/2019 | Kang | ...... | H01L 29/6653 |
| 2008/0272444 A1* | 11/2008 | Kitamura | ...... | H01L 21/3105 257/410 |
| 2010/0197124 A1* | 8/2010 | Jeong | ...... | H01L 21/3105 438/514 |

(Continued)

*Primary Examiner* — Anthony Ho
*Assistant Examiner* — Kevin Quinto
(74) *Attorney, Agent, or Firm* — Sterne, Kessler, Goldstein & Fox P.L.L.C.

(57) ABSTRACT

The present disclosure is directed to formation of a low-k spacer. For example, the present disclosure includes an exemplary method of forming the low-k spacer. The method includes depositing the low-k spacer and subsequently treating the low-k spacer with a plasma and/or a thermal anneal. The low-k spacer can be deposited on a structure protruding from the substrate. The plasma and/or thermal anneal treatment on the low-k spacer can reduce the etch rates of the spacer so that the spacer is etched less in subsequent etching or cleaning processes.

20 Claims, 11 Drawing Sheets

(56) References Cited

U.S. PATENT DOCUMENTS

2012/0219250 A1* 8/2012 Ren .................. G02B 6/132
                                                                                   385/14
2015/0145073 A1* 5/2015 Lee .................. H01L 29/6656
                                                                                    257/411

* cited by examiner

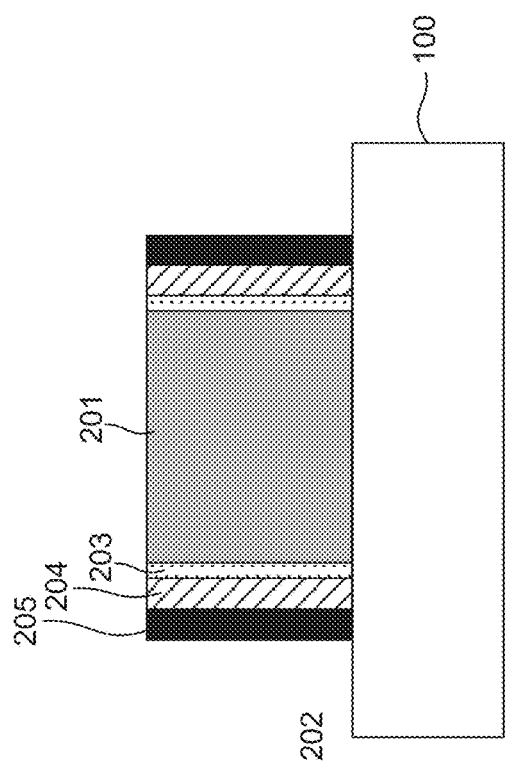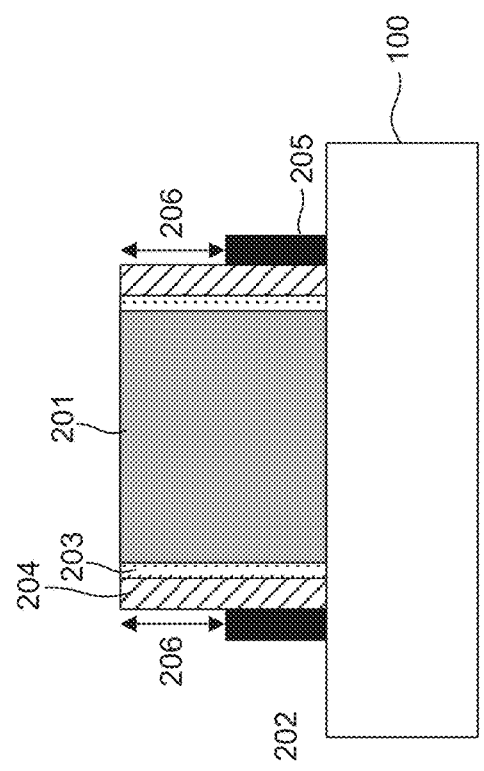
FIG. 2A
FIG. 2B

METHOD FOR FORMING A LOW-K SPACER

This application claims priority to U.S. Non-provisional patent application Ser. No. 15/589,659, titled "Method for Forming a Low-k Spacer," which was filed on May 8, 2017, and is incorporated herein by reference in its entirety.

BACKGROUND

With advances in semiconductor technology, the performance of semiconductor devices increases. For example, complementary metal-oxide-semiconductor (CMOS) transistors are increasingly faster with every new generation of semiconductor technology. One way to improve CMOS transistor speed is to reduce the delay of the device. For example, reducing the resistance-capacitance ("RC") delay of the CMOS transistor improves speed.

One consideration to reduce the RC delay of a transistor is to use a dielectric with a low dielectric constant ("k value"). Such a dielectric is often referred to as a "low-k dielectric." For example, the use of a low-k dielectric as a spacer that surrounds a CMOS gate structure can lower a capacitance between the CMOS gate and surrounding portions of the CMOS transistor. With the lower dielectric capacitance, the transistor's RC delay can be reduced.

BRIEF DESCRIPTION OF THE DRAWINGS

Aspects of this disclosure are best understood from the following detailed description when read with the accompanying figures. It is noted that, in accordance with the common practice in the industry, various features are not drawn to scale. In fact, the dimensions of the various features may be arbitrarily increased or reduced for clarity of discussion.

FIGS. 2A to 2C are cross-sectional views of a semiconductor device during formation of a low-k spacer with different etched amounts according to some embodiments.

Illustrative embodiments will now be described with reference to the accompanying drawings. In the drawings, like reference numerals generally indicate identical, functionally similar, and/or structurally similar elements.

DETAILED DESCRIPTION

Figure 1A:
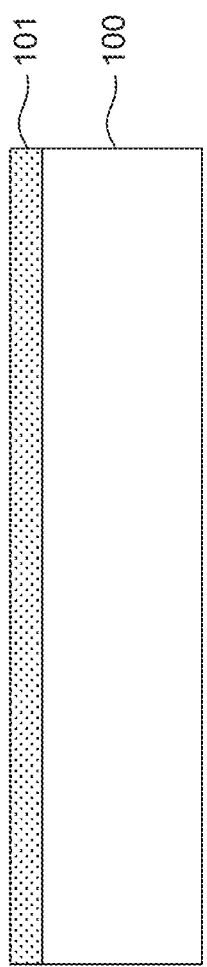
FIGS. 1A to 1K are cross-sectional views of a semiconductor device during formation of a low-k spacer according to some embodiments.

The following disclosure provides many different embodiments, or examples, for implementing different features of the provided subject matter. Specific examples of components and arrangements are described below to exemplify the present disclosure. These examples are not intended to be limiting. In addition, the present disclosure may repeat reference numerals and/or letters in the various examples. This repetition does not in itself dictate a relationship between the various embodiments and/or configurations discussed.

Spatially relative terms, such as "on," "in," "over," "beneath," "below," "lower," "above," "upper," "top," "bottom," and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

It is noted that references in the specification to "one embodiment," "an embodiment," "an example embodiment," "exemplary," etc., indicate that the embodiment described may include a particular feature, structure, or characteristic, but every embodiment may not necessarily include the particular feature, structure, or characteristic. Moreover, such phrases do not necessarily refer to the same embodiment. Further, when a particular feature, structure or characteristic is described in connection with an embodiment, it would be within the knowledge of one skilled in the art to effect such feature, structure or characteristic in connection with other embodiments whether or not explicitly described.

It is to be understood that the phraseology or terminology herein is for the purpose of description and not of limitation, such that the terminology or phraseology of the present specification is to be interpreted by those skilled in relevant art(s) in light of the teachings herein.

The term "about" as used herein indicates the value of a given quantity varies by ±10% of the value, unless noted otherwise.

As used herein, the term "etch rate" refers to the removal rate of a material in certain etching chemicals. The removal rate can be characterized by the amount of a target material (e.g., thickness) that is removed in a specific time period (e.g., a minute, a second, or an hour). The removal rate can be characterized on a flat wafer that does not have specific features or devices built on top of the wafer, or on a structure wafer that has structural features or devices already formed on the wafer. The term "wet etch rate" or "WER" refers to the etch rate in a liquid phase etchant. The term "dry etch rate" refers to the etch rate in a gas phase etchant or a plasma phase etchant.

As used herein, the term "substrate" describes a material onto which subsequent material layers are added. The substrate itself may be patterned, and materials added on top of it may also be patterned, or may remain without patterning. Furthermore, "substrate" may be any of a wide array of semiconductor materials such as, for example, silicon, germanium, gallium arsenide, or indium phosphide. Alternatively, the substrate may be electrically non-conductive such as, for example, a glass or sapphire wafer.

As used herein, the term "low-k" refers to a low dielectric constant, and the term "high-k" refers to a high dielectric constant. In the field of semiconductor device structures and manufacturing processes, high-k can refer to a dielectric constant greater than the dielectric constant of $SiO_2$ (i.e., greater than 3.9). Low-k, on the other hand, can refer to a dielectric constant that is lower than the dielectric constant of $SiO_2$ (i.e., lower than 3.9). In the present disclosure, the term "low-k" is also used in a relative environment when the k value of the target material is lower than a conventional material.

As used herein, the term "FET" refers to a field effect transistor. An example of a FET is a metal oxide semiconductor field effect transistor (MOSFET). MOSFETs can be, for example, planar structures built in and on the planar surface of a substrate such as a semiconductor wafer or built with vertical structures.

As used herein, the term "FinFET" refers to a FET that is formed over a fin that is vertically oriented with respect to the planar surface of a wafer. A FinFET includes a fin active region, source and drain regions, and a gate structure that is formed over the fin active region.

As used herein, the term "vertical" means nominally perpendicular to the surface of a substrate.

As used herein, the term "gate stack" refers to a stack of materials (e.g., oriented vertically) that is used as a gate structure for a CMOS transistor. A person of ordinary skill in the art would understand that a gate stack includes at least a conducting layer and an insulating layer. The gate stack can be patterned according to the design of the device.

As used herein, the term "form" or "formed" refers to a step or a plurality of steps of adding or removing a component or a plurality of components.

FIGS. 1A to 1F are cross-sectional views of a semiconductor device during formation of a low-k spacer according to some embodiments. The low-k spacer is formed on a substrate. According to some embodiments, the substrate can be a silicon (Si) wafer. In some embodiments, the substrate can have a plurality of doped regions, in which each of the doped regions can include n-type dopants (e.g., phosphorous (P) or arsenic (As)), p-type dopants (e.g., boron (B)), or other dopants (e.g., carbon (C)).

In referring to FIG. 1A, a dielectric layer 101 is formed above a substrate 100. The dielectric layer 101 can be formed above a portion of the substrate 100 that has an n-type doped region (e.g., n-well) or a p-type doped region (e.g., p-well). In some embodiments, the formation of the dielectric layer 101 can be performed using an atomic layer deposition (ALD) process and/or other suitable methods. The thickness of the dielectric layer 101 can be between 5 A to 50 A, according to some embodiments.

In some embodiments, the dielectric layer 101 can be a gate dielectric layer. In some embodiments, the dielectric layer 101 can be a high-k dielectric. The dielectric layer 101 can include silicon dioxide ($SiO_2$) or hafnium oxide ($HfO_2$), The dielectric layer 101 may optionally include other high-k dielectrics such as, for example, titanium oxide ($TiO_2$), hafnium zirconium oxide (HfZrO), tantalum oxide ($Ta_2O_3$), hafnium silicate ($HfSiO_4$), zirconium oxide ($ZrO_2$), zirconium silicate ($ZrSiO_2$), combinations thereof, or other suitable material.

Figure 1B:
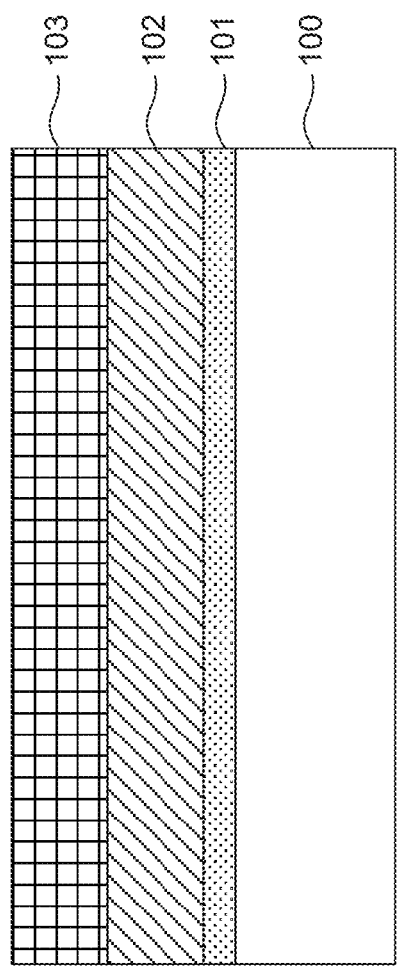

In referring to FIG. 1B, a layer of conducting material 102 can be formed above the dielectric layer 101. In some embodiments, the layer of conducting material 102 can include a doped polysilicon, a metal, a metal silicide, a metal nitride, or a combination thereof. A layer of insulating material 103 can be formed above the layer of conducting material 102. In some embodiments, the layer of insulating material 103 can be a hard mask that protects and insulates the upper surface of the layer of conducting material 102 during subsequent processes. In some embodiments, the layer of insulating material 103 can include silicon oxide ($SiO_x$), silicon nitride ($SiN_x$), silicon oxynitride ($SiO_xN_y$), or carbon containing materials.

Figure 1C:
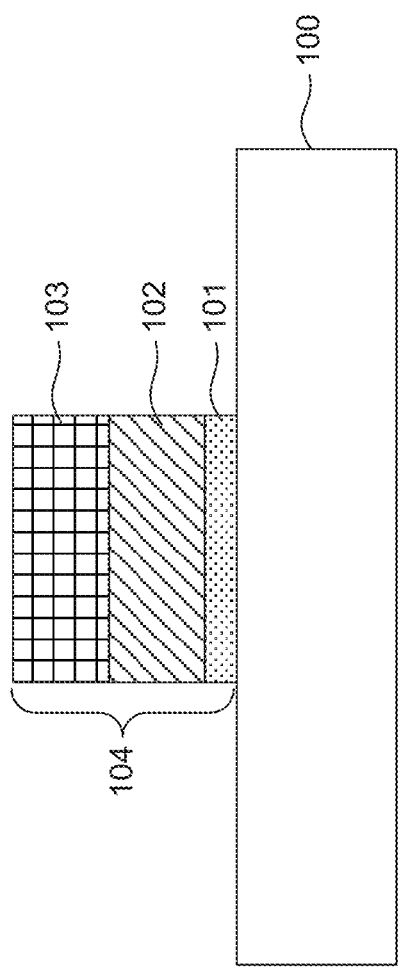

In referring to FIG. 1C, the layer of insulating material 103, the layer of conducting material 102, and the dielectric layer 101 can be patterned to form a gate stack 104 protruding from the substrate 100. In some embodiments, the patterning of the gate stack 104 is performed by using photolithography steps to define the pattern, followed by etch steps to remove the unwanted materials according to the pattern. In some embodiments, during the patterning process, the dielectric layer 101 is removed from the surface of the substrate 100 except for the gate stack areas.

In some embodiments, the gate stack 104 has an aspect ratio (e.g., height to width ratio) between about 1 and 10. In some embodiments, the gate stack 104 has an aspect ratio between about 3 and 4.

Figure 1D:
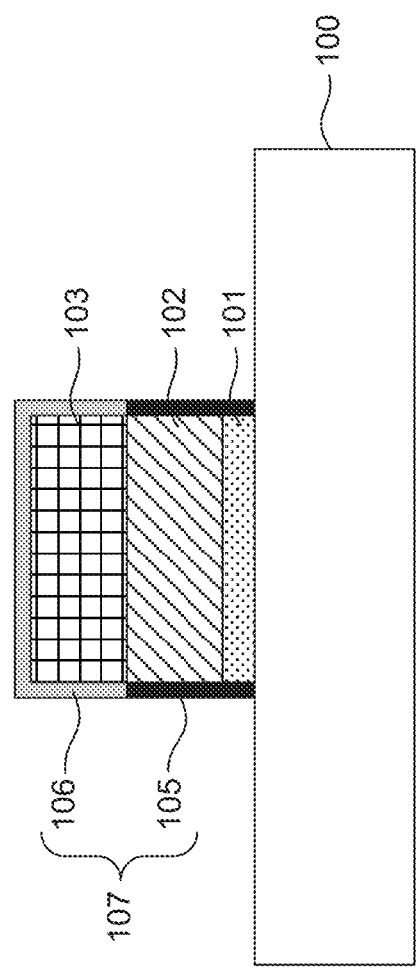

In referring to FIG. 1D, after formation of the gate stack 104, a native oxide layer 107 may be formed on the sidewall surfaces and the upper surface of the gate stack 104. In some embodiments, the native oxide layer 107 can be formed by a spontaneous process when the gate stack 104 is exposed to an ambient environment.

In some embodiments, the native oxide layer 107 can include multiple portions such as a first portion 105 and a second portion 106. The first portion 105 can be formed on the sidewalls of the layer of conducting material 102. The second portion 106 can be formed on the sidewalls and the upper surface of the layer of insulating material 103. In some embodiments, each of the first portion 105 and the second portion 106 of the native oxide layer 107 include silicon oxide ($SiO_x$). In some embodiments, the first portion 105 and the second portion 106 of the native oxide layer 107 have different compositions and/or different thicknesses.

Figure 1E:
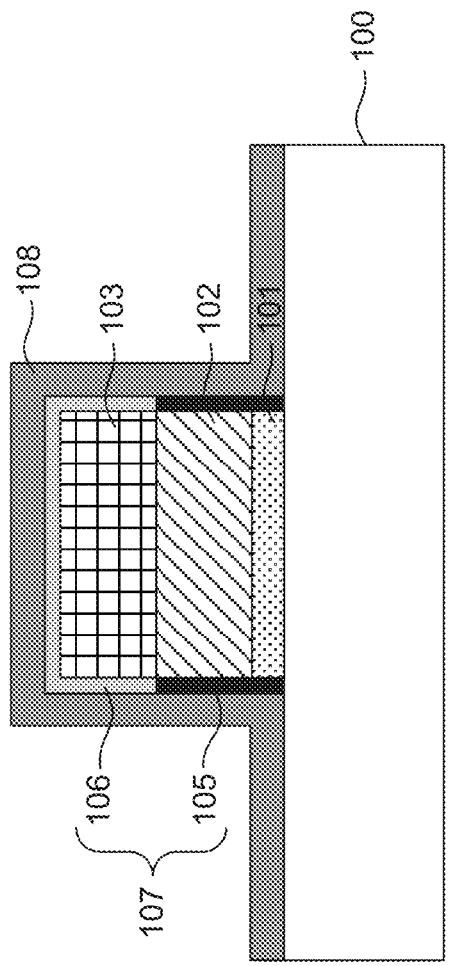

In referring to FIG. 1E, a first spacer 108 can be formed over the native oxide layer 107. In some embodiments, the first spacer 108 is formed by using an ALD process. In some embodiments, the ALD process uses a silane-based gas, a hydrocarbon gas, an ammonia gas, and an oxidizing gas as precursors. In some embodiments, the silane-based gas is hexachlorodisilane (HCD), the hydrocarbon gas is propylene ($C_3H_6$), and the oxidizing gas is oxygen ($O_2$). A person of ordinary skill in the art would understand that the ALD process for the first spacer 108 can use alternative precursors other than the gases discussed above.

In some embodiments, the ALD process for forming the first spacer 108 can use a sequence of steps, where each step uses a different precursor. In some embodiments, the ALD process can include a sequence of process steps using HCD, $C_3H_6$, $O_2$, and $NH_3$ as precursors (e.g., HCD=>C3H6=>O2=>NH3). A person of ordinary skills in the art would understand that the ALD process for the first spacer 108 can also include different sequences of precursors or different process steps with different precursors. In some embodiments, the ALD process can be performed at a temperature between about 600° C. and 650° C. (e.g., 630° C.) for a time period of three to four hours. A person of ordinary skills in the art should understand that the ALD process for the first spacer 108 can also be performed at a temperature higher than or lower than this temperature range and for a time period longer or shorter than three to four hours.

In some embodiments, the first spacer 108 is composed of four elements: silicon (Si), carbon (C), oxygen (O), and nitrogen (N). In some embodiments, the atomic percentages for these elements are about Si-33.4%, C-4.6%, 0-42.6%, and N-19.5%. A person of ordinary skill in the art would understand that the first spacer 108 may include other elements, and the atomic percentages of these other elements may be different from the percentages disclosed in this disclosure. In some embodiments, the thickness of the first spacer 108 is between 35 Å and 45 Å. A person of ordinary skill in the art would understand that the first spacer 108 may be thicker than 45 Å and/or thinner than 35 Å according to requirements of particular design rules or device specifications. In some embodiments, the dielectric constant (k-value) of the first spacer 108 is between 4.8 and 5.2. In some embodiments, the density of the first spacer 108 is between about 2.4 and 2.5 (e.g., 2.47). In some embodiments, the breakdown voltage of the first spacer 108 is between about 2.5V and 3.5V (e.g., 3 V).

As would be understood by a person of ordinary skill in the art, photolithography, implantation, cleaning, and annealing process steps can be performed prior to forming the first spacer 108. The photolithography step can define n-type source/drain regions and p-type source/drain regions. The implantation steps can include source/drain implantation steps that use n-type dopants for the n-type source/drain regions and p-type dopants for the p-type source/drain regions. A cleaning step follows the implantation steps, in which the cleaning step can use liquid phase, gas phase, or plasma phase chemicals. The cleaning step removes residual dopants on the surface of the substrate 100 after the implantation steps. The cleaning step can also remove residual photoresist after the photolithography step. In some embodiments, an anneal process also follows the implantation steps to electrically activate the implanted dopants and partially or fully heals the damage caused on the substrate 100 by the implantation steps.

Figure 1F:
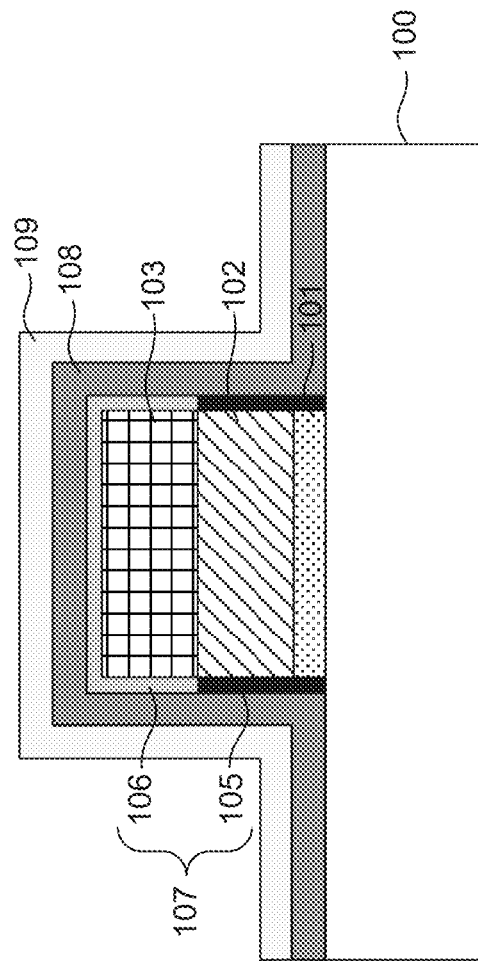

In referring to FIG. 1F, a second spacer 109 is formed over the first spacer 108. In some embodiments, formation of the second spacer 109 includes deposition of the second spacer 109 followed by treatment the second spacer 109. In some embodiments, depositing the second spacer 109 is performed by using an ALD process or a Chemical Vapor Deposition (CVD) process. In some embodiments, the ALD process for forming the second spacer 109 is performed at a temperature between 75° C. and 85° C. for a period of time between 400 and 500 minutes.

The ALD process for forming the second spacer 109 can use a plurality of precursors such as, for example, water ($H_2O$) and Calypso ($CH_2Cl_6Si_2$). In some embodiments, the ALD process for forming the second spacer 109 can use a catalyst such as, for example, Pyridine ($C_5H_5N$). A person of ordinary skill in the art would understand that the ALD process for forming the second spacer may use different precursors or catalysts. In some embodiments, the ALD process for forming the second spacer 109 can include a certain number of cycled processes, and each cycled process can include two steps: a first step that uses Calypso as a precursor and Pyridine as a catalyst; and a second step that uses $H_2O$ as a precursor and Pyridine as a catalyst.

In some embodiments, treatment of the second spacer 109 includes two steps: a plasma treatment step and a thermal annealing step. In some embodiments, the plasma treatment step uses a helium (He) plasma. In some embodiments, the He plasma treatment uses a direct plasma process. The direct plasma process is a plasma process, in which the wafer is directly exposed to plasma and its products. In some embodiments, the He plasma process uses a plasma power between 1000 W and 2000 W (e.g., 1500 W). In some embodiments, the He plasma treatment step is performed at a temperature between 400° C. and 500° C. (e.g., about 450° C.). In some embodiments, the He plasma treatment step is performed for a time period of between 1 minute and 3 minutes (e.g., about 2 minutes). A person of ordinary skill in the art would understand that the He plasma process may be performed with a different plasma power, at different temperatures, and for different time periods than those disclosed in the present disclosure. In some embodiments, the He plasma process can be a remote plasma process. The remote plasma process is a plasma process, in which the wafer is located remote to the location of plasma generation.

In some embodiments, the thermal annealing step uses an $N_2$ gas or an $H_2$ gas. In some embodiments, the thermal annealing step using the $N_2$ gas is performed at a temperature between 500° C. and 700° C. (e.g., about 600° C.). In some embodiments, the thermal annealing step using the $N_2$ gas is performed for a time period of between 25 minute and 35 minutes (e.g., about 30 minutes). In some embodiments, the thermal annealing step using the $N_2$ gas is performed at atmospheric pressure. A person of ordinary skill in the art would understand that the thermal annealing step using the $N_2$ gas may be performed at a different temperature and for a different period of time than those disclosed in the present disclosure.

In some embodiments, the deposition of the second spacer 109 with the ALD process, the plasma treatment step, and the thermal annealing step can be performed in three different process chambers on three different tool frames. The wafer can be exposed to an ambient environment between the steps.

In some embodiments, formation of the second spacer 109 includes a continuous process that completes the deposition of the second spacer 109, the first treatment of the spacer 109, and the second treatment of the spacer 109 in the same process step without exposing the wafer to the ambient environment. Such a process is often referred to as an "in-situ process." In some embodiments, the in-situ process is completed in separate process chambers within a same process tool frame without exposing the wafer to the ambient environment.

In some embodiments, the in-situ process starts with an ALD process at about 80° C. and a period of time of about 450 minutes. The ALD process deposits the second spacer 109 over the first spacer 108. In some embodiments, the wafer is moved out of the ALD process chamber to a plasma anneal chamber, without moving the wafer out of the process tool frame and exposing the wafer to the ambient environment. The wafer temperature is then elevated to about 450° C. for a plasma treatment step in the plasma anneal chamber. A He plasma is formed with a plasma power of about 1500 W during the plasma anneal step. The duration of the He plasma treatment step is about 2 minutes. After the plasma treatment step, the wafer is cooled down to about 400° C. before starting a thermal annealing process. In some embodiments, the wafer undergoes a cool down time period of between 25 to 40 minutes after the plasma treatment step and prior to the thermal annealing step. The cool down time period is used to recondition the wafer for the next thermal annealing process such as pumping out the residual He, thermally stabilizing the wafer, and driving out contaminants and products produced during the He plasma treatment step. In some embodiments, the wafer is moved out of the plasma anneal chamber to a thermal anneal chamber for the thermal annealing step, without moving the wafer out of the process tool frame and exposing the wafer to the ambient environment. In some embodiments, the wafer stays in the plasma anneal chamber for the thermal annealing step. In some embodiments, the thermal annealing process heats the wafer to about 600° C. in an $N_2$ environment or an $H_2$ environment. In some embodiments, the thermal annealing process lasts about 30 minutes.

In some embodiments, the second spacer 109 includes a composition of Si, O, and C. In some embodiments, the atomic percentages of the elements are about Si-26.3%, C-10.6%, and 0-57.1%. A person of ordinary skill in the art would understand that the second spacer 109 may include elements other than the ones disclosed in this disclosure, and the atomic percentages of the elements may be different from the percentages disclosed in this disclosure. In some embodiments, the thickness of the second spacer 109 is between 35 Å and 45 Å (e.g., about 45 Å). A person of ordinary skill in the art would understand that the second spacer 109 may be thicker or thinner than this range. In some embodiments, the density of the second spacer 109 is about 2.05. In some embodiments, the breakdown voltage of the second spacer 109 is 3.5 V or higher. In some embodiments, the dielectric constant (k-value) of the second spacer 109 is between 3.5 and 4.1 (e.g., about 3.8).

After formation of the first spacer but prior to formation of the second spacer 109, a person of ordinary skill in the art would understand that photolithography, implantation, photolithography, cleaning, and annealing process steps can occur. The photolithography step can define n-type source/drain regions and p-type source/drain regions. The implantation steps can include steps that use n-type dopants to form n-type source/drain regions and p-type dopants to form p-type source/drain regions. In some embodiments, the n-type LDD regions and p-type LDD regions are defined by photolithography steps before implantation steps. A cleaning step follows the implantation steps, in which the cleaning step can use liquid phase, gas phase, or plasma phase chemicals. The cleaning step removes residual dopants left on the surface of the first spacer 108. The cleaning step can also remove residual photoresist after the photolithography step. In some embodiments, an anneal process follows the implantation steps to electrically activate the implanted dopants and partially or fully heals damage caused on the substrate 100 by the implantation steps.

Figure 1G:
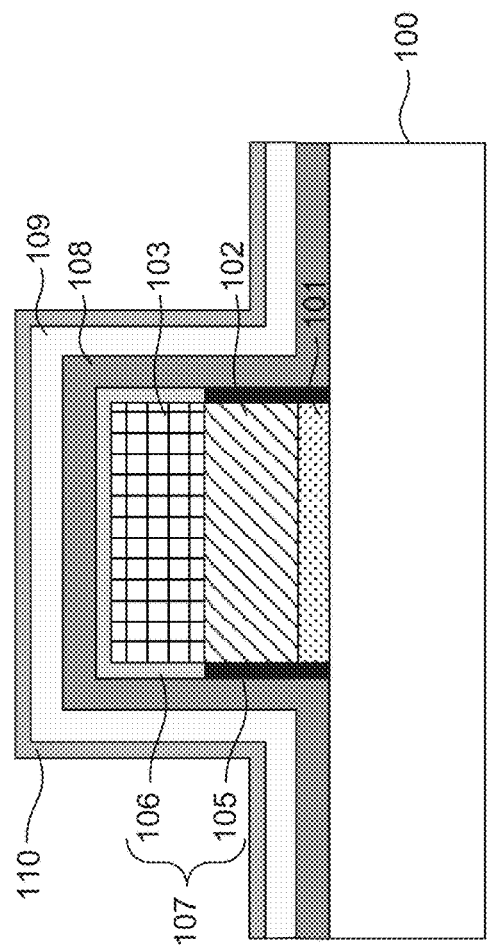

In referring to FIG. 1G, a layer of sacrificial insulating material 110 is formed on the second spacer 109. In some embodiments, the sacrificial insulating material 110 includes silicon nitride ($SiN_x$). In some embodiments, the sacrificial insulating material 110 is formed with an ALD process or a CVD process. A purpose of the sacrificial material 110 is to protect the second spacer 109 and the first spacer 108 during cleaning steps. In some embodiments, the sacrificial insulating material 110 is removed during subsequent process steps.

Figure 1H:
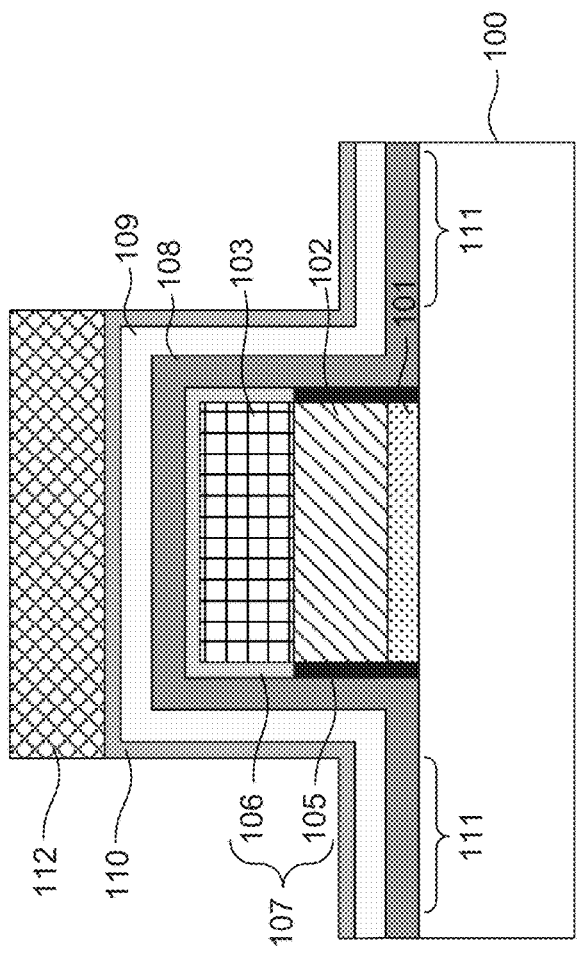

In referring to FIG. 1H, photolithography steps are performed to expose source/drain regions 111. Unexposed areas are covered with a photoresist 112, as illustrated by FIG. 1H. In some embodiments, cleaning steps are performed after the photolithography steps but before a subsequent epitaxy step. A purpose of the cleaning steps is to condition the Si surface of the source/drain regions 111 for the subsequent epitaxy step. In some embodiments, the cleaning steps use liquid phase, gas phase, or plasma phase chemicals.

Figure 1I:
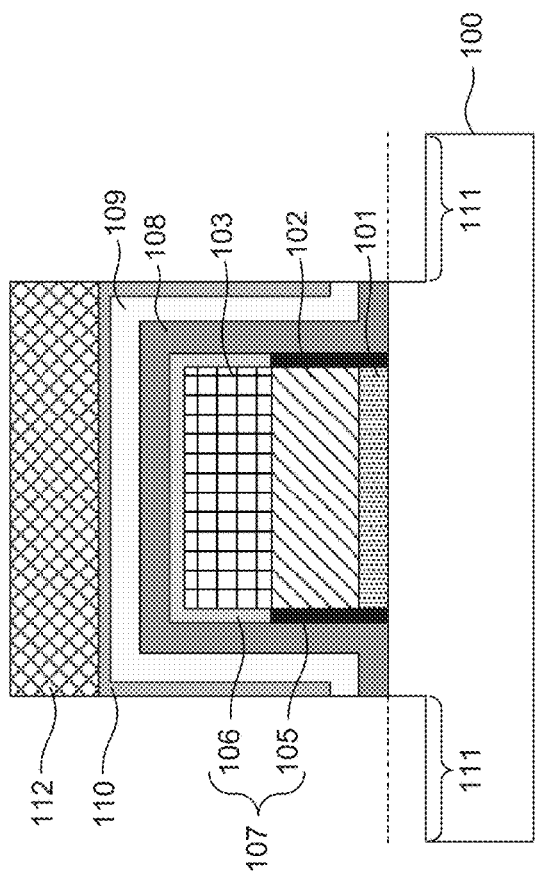

In some embodiments, the cleaning steps include a first dry cleaning step using a gas phase or plasma phase carbon fluoride ($CF_4$) and hydrogen bromide (HBr). In some embodiments, the first dry cleaning step using $CF_4$ and HBr is performed at a temperature between 45° C. and 65° C. In some embodiments, the first dry cleaning step using $CF_4$ and HBr etches the sacrificial insulating material 110, the second spacer 109, and the first spacer 108 in the vertical direction and exposes the Si surface from the substrate 100 in the source/drain regions 111. In some embodiments, the first dry cleaning step using $CF_4$ and HBr further etches a portion of the Si surface exposed in the source/drain regions 111, as illustrated by FIG. 1I. A person of ordinary skill in the art would understand that chemicals other than $CF_4$ and HBr may be used in the first dry cleaning step.

Figure 1J:
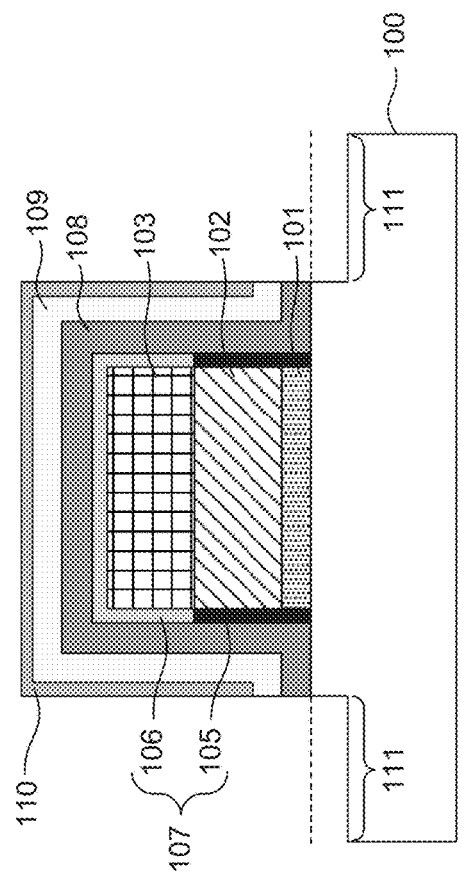

In some embodiments, the cleaning steps also include a first wet cleaning step using liquid phase sulfuric acid ($H_2SO_4$) and peroxide ($H_2O_2$). In some embodiments, the first wet cleaning step removes the photoresist 112, as illustrated by FIG. 1J. A person of ordinary skill in the art would understand that chemicals other than $H_2SO_4$ may be used in the first dry cleaning step.

In some embodiments, the cleaning steps include a second dry cleaning step using gas phase or plasma phase nitrogen fluoride ($NF_3$) and ammonia ($NH_4$). In some embodiments, the cleaning steps also include a second wet cleaning step using liquid phase HF. In some embodiments, the cleaning steps further include a third dry cleaning step using gas phase or plasma phase $NF_3$ and $NH_4$. A purpose of the second dry cleaning step, the second wet cleaning step, and the third dry cleaning step is to remove residual byproducts, native oxides, and low quality Si formed in previous steps to prepare the surface of the source/drain regions 111 for the epitaxy step.

Figure 1K:
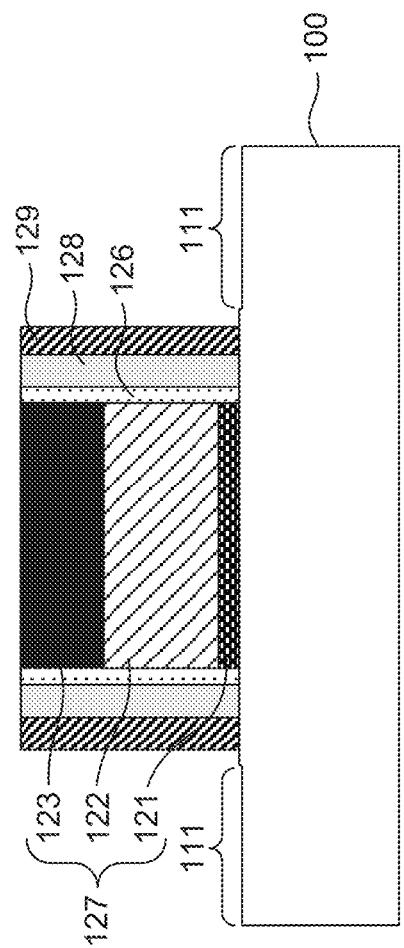

In referring to FIG. 1K, according to some embodiments, an upper portion of the first spacer 108 and the second spacer 109 that is formed over the upper surface of the gate stack 104 is removed. In some embodiments, a first spacer 128 is a portion of the first spacer 108 after an upper portion of the first spacer 108 is removed, and a second spacer 129 is a portion of the second spacer 109 after an upper portion of the second spacer 109 is removed. In some embodiments, the gate stack 104 is replaced by a metal gate stack 127 using a series of process steps. In some embodiments, the series of process steps include film deposition steps, chemical mechanical planarization (CMP) steps, dry etch steps, wet etch steps, cleaning steps, implantation steps, plasma and thermal treatment steps, and photolithography steps. In some embodiments, the metal gate stack 127 includes a gate dielectric layer 121, a metal layer 122, and an insulating layer 123. In some embodiments, the dielectric layer 121 includes hafnium oxide ($HfO_2$). In some embodiments, the dielectric layer 121 may optionally include other high-k dielectrics such as, for example, $TiO_2$, $HfZrO$, $Ta_2O_3$, $HfSiO_4$, $ZrO_2$, $ZrSiO_2$, combinations thereof, or other suitable material. In some embodiments, the formation of the dielectric layer 121 is performed using an ALD process and/or other suitable methods. In some embodiments, a sidewall of the gate stack 127 is in contact with a native oxide 126. In some embodiments, the native oxide 126 is in contact with a first spacer 128. In some embodiments, the first spacer 128 is further in contact with a second spacer 129. An example of the native oxide 126 is the native oxide 107 described above in FIG. 1D.

In some embodiments, the metal layer 122 includes a metal with a work function value so that a desired threshold voltage Vt is achieved for metal gate stack 127. In some embodiments, the metal layer 122 can be an n-type work function metal such as, for example, titanium (Ti), silver (Ag), tantalum aluminum (TaAl), tantalum aluminum carbide (TaAlC), titanium aluminum nitride (TiAlN), tantalum carbide (TaC), tantalum carbon nitride (TaCN), tantalum silicon nitride (TaSiN), mangnese (Mn), zirconium (Zr), other suitable n-type work function materials, or combinations thereof. In some embodiments, the metal layer 122 can be a p-type work function metal such as, for example, titanium nitride (TiN), tantalum nitride (TaN), ruthenium (Ru), molybdenum (Mo), Al, tungsten nitride (WN), zirconium silicide ($ZrSi_2$), molybdenum silicide ($MoSi_2$), tantalum silicide ($TaSi_2$), nickel silicide ($NiSi_2$), other suitable p-type work function materials, or combinations thereof. In some embodiments, the metal gate layer 122 is deposited by CVD, PVD, and/or other suitable process.

In some embodiments, the insulating layer 123 includes silicon oxide ($SiO_x$), silicon nitride ($SiN_x$), and/or other suitable materials, or a combination thereof. In some embodiments, the insulating layer 123 can be deposited by CVD, PVD, ALD, and/or other suitable process.

In some embodiments, the gate stack 127 has an aspect ratio (e.g., height to width ratio) between about 1 and 10. In some embodiments, the gate stack 127 has an aspect ratio between about 3 and 4.

Figure 2C:
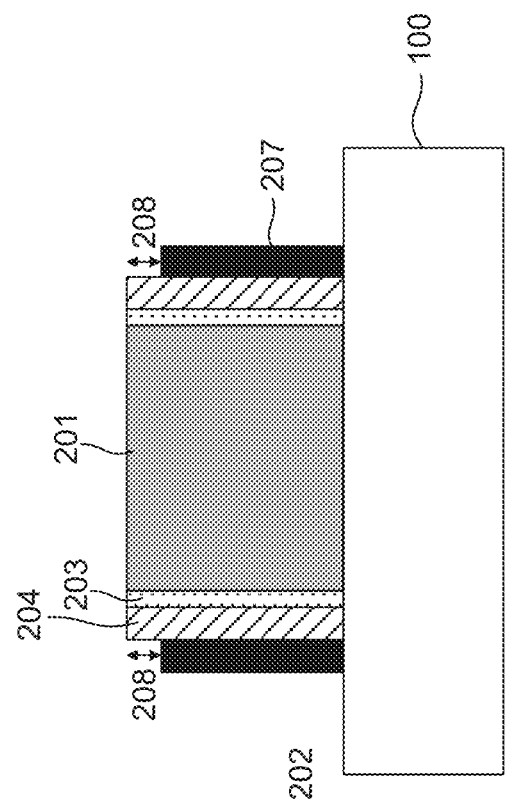

FIGS. 2A to 2C are cross-sectional views of a semiconductor device during formation of a low-k spacer with different etched amounts according to some embodiments. In some embodiment, the low-k spacer has a low etch in etch chemicals. As a result, the low-k spacer can preserve its shape throughout cleaning and etching steps dues to its low etch rate.

In referring to FIG. 2A, a gate stack 201 includes a native oxide 203, a first spacer 204, and a second spacer 205 on the sidewall surfaces. In some embodiments, the gate stack 201 includes a gate dielectric, an insulating material, and a conducting material (not shown in the figure). If after formation, the gate stack 201 and spacers 204 and 205 do not go through other processes (e.g., etch processes and cleaning processes), the spacers keep their shape and the top of the spacers 204 and 205 align with the top of the gate stack 201, as illustrated by FIG. 2A.

However, the gate stack 201 and spacers 204 and 205 go through many subsequent processes after their formation. The subsequent processes expose the gate stack and spacers 204 and 205 to etching chemicals and cleaning chemicals that can cause etching of the second spacer 205 when exposed to these chemicals. As a result, a portion of the second spacer 205 is lost during the subsequent processes, as illustrated by FIG. 2B. The portion of the second spacer 205 that is lost is labeled as portion 206. The etch rates of the second spacer 205 in the etching and cleaning chemicals used in the subsequent processes affect the portion 206 of the second spacer 205 that is lost during these processes.

In referring to FIG. 2C, a second spacer 207 with a low etch rate can be formed using methods disclosed in the present disclosure. As illustrated by FIG. 2C, a portion 208 of the second spacer 207 is lost due to the etching and cleaning chemicals used during subsequent processes. In some embodiments, the portion 208 of the second spacer 207 has a shorter vertical length than the portion 206 of the second spacer 205 illustrated in FIG. 2B due to its reduced etch rates.

Figure 3:
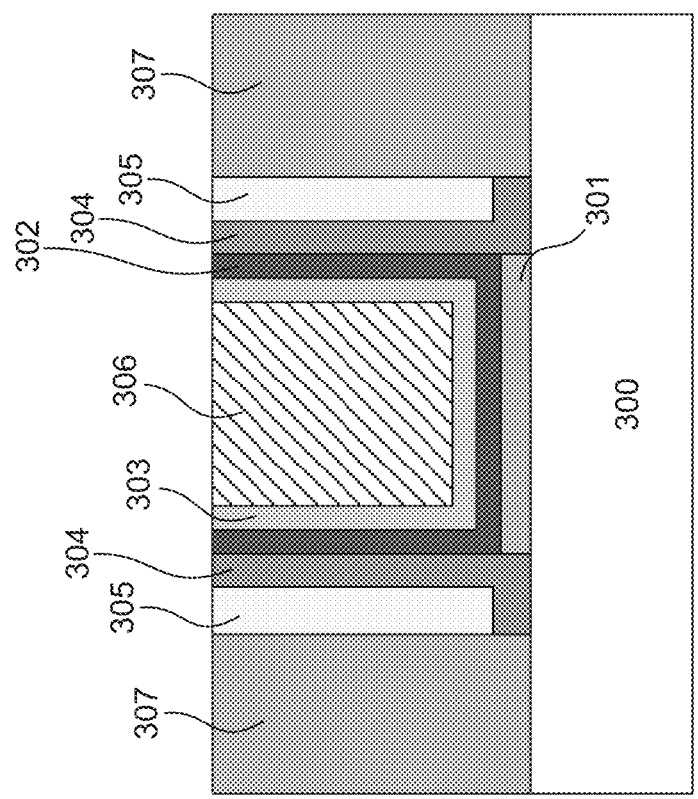
FIG. 3 is a cross sectional view of a semiconductor device during formation of a low-k spacer on a FinFET device, according to some embodiments.

FIG. 3 is a cross sectional view of a semiconductor device during formation of a low-k spacer on a FinFET device according to some embodiments. In referring to FIG. 3, a metal gate layer 306 is formed over a substrate 300. In some embodiments, the substrate 300 can be a fin active region. In some embodiments, the metal gate layer 306 is formed by removing a dummy gate structure followed by depositing the metal gate layer 306 to fill the trench formed by the removal of the dummy gate structure. A gate dielectric layer can be formed on the surface of the substrate 300. In some embodiments, the gate dielectric layer includes an interfacial layer 301. The interfacial layer 301 can include an oxide layer such as a silicon oxide layer, which can be formed through a thermal oxidation of the surface of the substrate 300, according to some embodiments. In some embodiments, the gate dielectric layer further includes a high-k dielectric layer 302. The dielectric constant (k-value) of the high-k dielectric material is higher than about 3.9, and can be higher than about 7.0. The high-k dielectric layer 302 can include such as, for example, hafnium oxide ($HfO_2$), titanium oxide ($TiO_2$), hafnium zirconium oxide (HfZrO), tantalum oxide ($Ta_2O_3$), hafnium silicate ($HfSiO_4$), zirconium oxide ($ZrO_2$), zirconium silicate ($ZrSiO_2$), combinations thereof, or other suitable material.

In some embodiments, a stacked layer 303 is formed over the gate dielectric layer. The stacked layer 303 can include a diffusion barrier layer and one (or more) work-function layer over the diffusion barrier layer. The diffusion barrier layer can be formed of titanium nitride (TiN) or titanium silicon nitride (TiSiN). The work-function layer determines the work function of the gate, and includes at least one layer, or a plurality of layers formed of different materials. The material of the work-function layer is selected according to whether the respective FinFET is an n-type FinFET or a p-type FinFET. For an n-type FinFET, the work-function layer may include a TiN layer, a titanium aluminum (TiAl) layer, and/or a titanium aluminum carbide (TiAlC) layer. For a p-type FinFET, the work-function layer may include a TiN layer and/or a TiAl layer. In some embodiments, the stacked layer 303 can include another barrier layer (e.g. TiN) over the work-function layer.

In some embodiments, the metal gate layer 306 is formed over the stacked layer 303 and can include tungsten (W), cobalt (Co), nickel (Ni), or ruthenium (Ru). The first spacer 304 is formed over the side surfaces of the metal gate layer 306 and the second spacer 305 is formed on the first spacer 304. In some embodiments, an interlayer dielectric (ILD) 307 is formed over the side surfaces of the second spacer 305. In some embodiments, the ILD 307 can be an oxygen-containing dielectric such as an oxide.

In some embodiments, the first spacer 304 is formed using is a similar method as the first spacer 128 and the second spacer 305 is formed using a similar method as the second spacer 129, as discussed in FIG. 1K. Similar to the second spacer 129, the second spacer 305 is a low-k spacer with reduced etch rates in etching and cleaning chemicals. As a result, the loss of the second spacer 305 during subsequent etching and cleaning processes is reduced and the shape of the second spacer 305 is reserved.

Figure 4:
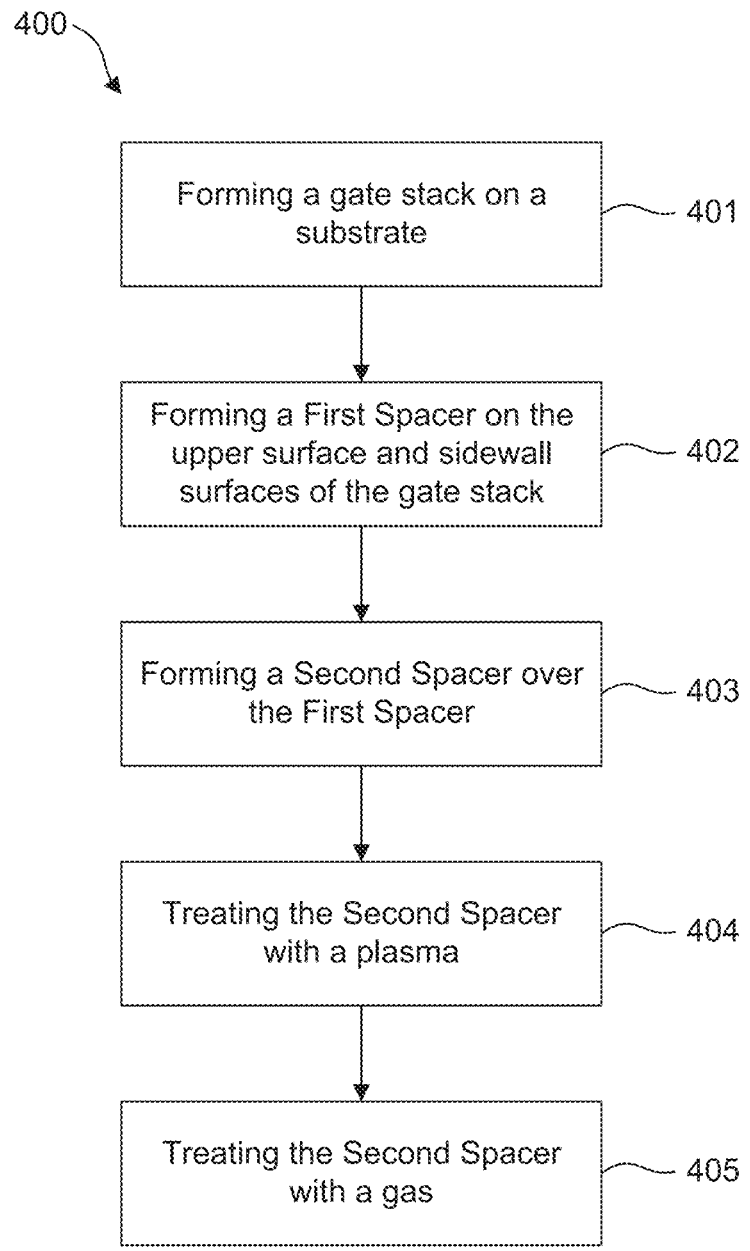
FIG. 4 is a flow diagram of a method of forming a spacer, according to some embodiments.

FIG. 4 is a flow diagram of a method 400 of forming a spacer, according to some embodiments. Based on the disclosure herein, a person of ordinary skill in the art will recognize that other operations in method 400 can be performed. Further, a person of ordinary skill in the art will recognize that the operations of method 400 can be performed in a different order and/or vary.

At operation 401, a gate stack is formed on and/or within a semiconductor structure. The semiconductor structure can include bulk silicon (e.g., doped or undoped silicon) or an active layer of a silicon-on-insulator (SOI) substrate. The semiconductor structure can include semiconductor material such as, for example, silicon, germanium, silicon germanium, silicon germanium on insulator (SGOI), or combinations thereof. Active devices can be formed on and/or within the semiconductor substrate. Active and passive devices such as, for example, transistors, diodes, capacitors, resistors, inductors, and the like can be formed.

In some embodiments, the semiconductor structure includes isolation structures, insulator layers, and/or raised features such as, for example, fins. Fins can be fabricated using suitable processes including photolithography and etch processes. Isolation structures can be made of a dielectric material and can include a multi-layer structure such as, for example, a structure having one or more liner layers. In some embodiments, an optional insulator layer can be formed by depositing an insulator material and performing subsequent photolithography and etching processes.

In some embodiments, the gate stack includes a gate insulation layer, a conductive layer and a cap insulation layer. The gate insulation layer can include silicon dioxide ($SiO_2$) or high-k dielectrics. High-k dielectrics include such as, for example, hafnium oxide ($HfO_2$), titanium oxide ($TiO_2$), hafnium zirconium oxide (HfZrO), tantalum oxide ($Ta_2O_3$), hafnium silicate ($HfSiO_4$), zirconium oxide ($ZrO_2$), zirconium silicate ($ZrSiO_2$), combinations thereof, or other suitable material.

In some embodiments, the conductive layer can include a doped polysilicon, a metal, a metal silicide, a metal nitride, or a combination thereof. In some embodiments, the cap insulation layer can include silicon oxide ($SiO_x$), silicon nitride ($SiN_x$), silicon oxynitride ($SiO_xN_y$), or carbon containing materials.

In some embodiments, the gate stack is a sacrificial gate stack and is later replaced by a metal gate stack. In some embodiments, the metal gate stack includes a gate dielectric layer, a metal layer, and an insulating layer. In some embodiments, the metal layer includes an n-type work function metal such as, for example, titanium (Ti), silver (Ag), tantalum aluminum (TaAl), tantalum aluminum carbide (TaAlC), titanium aluminum nitride (TiAlN), tantalum carbide (TaC), tantalum carbon nitride (TaCN), tantalum silicon nitride (TaSiN), manganese (Mn), zirconium (Zr), other suitable n-type work function materials, or combinations thereof. In some embodiments, the metal layer includes p-type work function metal such as, for example, titanium nitride (TiN), tantalum nitride (TaN), ruthenium (Ru), molybdenum (Mo), Al, tungsten nitride (WN), zirconium silicide ($ZrSi_2$), molybdenum silicide ($MoSi_2$), tantalum silicide ($TaSi_2$), nickel silicide ($NiSi_2$), other suitable p-type work function materials, or combinations thereof.

At operation 402, a first spacer is formed on the upper surface and sidewall surfaces of the gate stack. In some embodiments, the first spacer is formed by using an ALD process. In some embodiments, the ALD process can be performed at a temperature between about 600° C. and 650° C. (e.g., 630° C.) for a time period of three to four hours. In some embodiments, the first spacer is composed of four elements: silicon (Si), carbon (C), oxygen (O), and nitrogen (N). In some embodiments, the thickness of the first spacer is between 35 Å and 45 Å. In some embodiments, the dielectric constant (k-value) of the first spacer is between 4.8 and 5.2.

At operation 403, a second spacer is formed over the first spacer. In some embodiments, forming the second spacer is performed by using an ALD process or a Chemical Vapor Deposition (CVD) process. In some embodiments, the ALD process for forming the second spacer is performed at a temperature between 75° C. and 85° C. for a period of time between 400 and 500 minutes. In some embodiments, the second spacer is composed of three elements: silicon (Si), carbon (C) and oxygen (O). In some embodiments, the thickness of the second spacer is between 35 Å and 45 Å.

At operation 404, the second spacer is treated with a plasma. In some embodiments, the plasma treatment step uses a helium (He) plasma. In some embodiments, the He plasma treatment uses a direct plasma process. In some embodiments, the He plasma process uses a plasma power between 1000 W and 2000 W (e.g., 1500 W). In some embodiments, the He plasma treatment step is performed at a temperature between 400° C. and 500° C. (e.g., about 450° C.). In some embodiments, the He plasma treatment step is performed for a time period of between 1 minute and 3 minutes (e.g., about 2 minutes).

At operation 405, the second spacer is treated with a gas under elevated temperature. In some embodiments, the treatment with a gas is a thermal annealing process that uses an $N_2$ gas or an $H_2$ gas. In some embodiments, the thermal annealing process can use $N_2$ gas and be performed at a temperature between 500° C. and 700° C. (e.g., about 600° C.) for a time period of between 25 minute and 35 minutes (e.g., about 30 minutes). The thermal annealing step using the $N_2$ gas can be performed at atmospheric pressure. A person of ordinary skill in the art would understand that the thermal annealing step using the $N_2$ gas may be performed at a different temperature and for a different period of time than those disclosed in the present disclosure.

In some embodiments, after the treatment discussed in operations 304 and 305, the second spacer has a dielectric constant between about 3.8 and 3.9.

Figure 5:
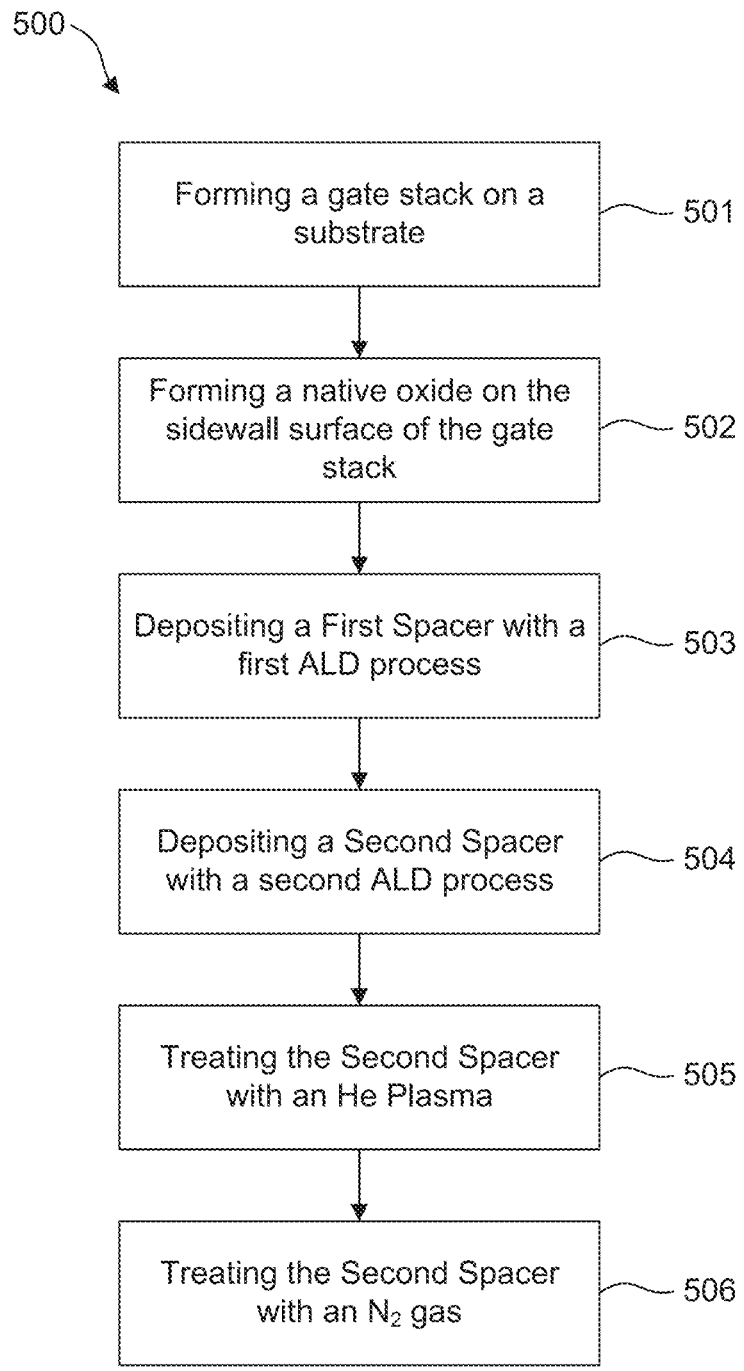
FIG. 5 is a flow diagram of a method of forming a spacer, according to some embodiments.

FIG. 5 is a flow diagram of a method 500 of forming a spacer, according to some embodiments. Based on the disclosure herein, a person of ordinary skill in the art will recognize that other operations in method 500 can be performed. Further, a person of ordinary skill in the art will recognize that the operations of method 500 can be performed in a different order and/or vary.

At operation 501, a gate stack is formed on and/or within a semiconductor structure. The semiconductor structure can include bulk silicon (e.g., doped or undoped silicon) or an active layer of a silicon-on-insulator (SOI) substrate. The semiconductor structure can include semiconductor material such as, for example, silicon, germanium, silicon germanium, silicon germanium on insulator (SGOI), or combinations thereof. Active devices can be formed on and/or within the semiconductor substrate. Active and passive devices such as, for example, transistors, diodes, capacitors, resistors, inductors, and the like can be formed.

In some embodiments, the semiconductor structure includes isolation structures, insulator layers, and/or raised features such as, for example, fins. Fins can be fabricated using suitable processes including photolithography and etch processes. Isolation structures can be made of a dielectric material and can include a multi-layer structure such as, for example, a structure having one or more liner layers. In some embodiments, an optional insulator layer can be formed by depositing an insulator material and performing subsequent photolithography and etching processes.

In some embodiments, the gate stack includes a gate insulation layer, a conductive layer and a cap insulation layer. The gate insulation layer can include silicon dioxide ($SiO_2$) or high-k dielectrics. High-k dielectrics include such as, for example, hafnium oxide ($HfO_2$), titanium oxide ($TiO_2$), hafnium zirconium oxide (HfZrO), tantalum oxide ($Ta_2O_3$), hafnium silicate ($HfSiO_4$), zirconium oxide ($ZrO_2$), zirconium silicate ($ZrSiO_2$), combinations thereof, or other suitable material.

In some embodiments, the conductive layer can include a doped polysilicon, a metal, a metal silicide, a metal nitride, or a combination thereof. In some embodiments, the cap insulation layer can include silicon oxide ($SiO_x$), silicon nitride ($SiN_x$), silicon oxynitride ($SiO_xN_y$), or carbon containing materials.

In some embodiments, the gate stack is a sacrificial gate stack and is later replaced by a metal gate stack. In some embodiments, the metal gate stack includes a gate dielectric layer, a metal layer, and an insulating layer. In some embodiments, the metal layer includes an n-type work function metal such as, for example, titanium (Ti), silver (Ag), tantalum aluminum (TaAl), tantalum aluminum carbide (TaAlC), titanium aluminum nitride (TiAlN), tantalum carbide (TaC), tantalum carbon nitride (TaCN), tantalum silicon nitride (TaSiN), manganese (Mn), zirconium (Zr), other suitable n-type work function materials, or combinations thereof. In some embodiments, the metal layer includes p-type work function metal such as, for example, titanium nitride (TiN), tantalum nitride (TaN), ruthenium (Ru), molybdenum (Mo), Al, tungsten nitride (WN), zirconium silicide (ZrSi$_2$), molybdenum silicide (MoSi$_2$), tantalum silicide (TaSi$_2$), nickel silicide (NiSi$_2$), other suitable p-type work function materials, or combinations thereof.

At operation 502, a native oxide is formed on the sidewall surface of the gate stack. In some embodiments, the native oxide can be formed by a spontaneous process when the gate stack is exposed to an ambient environment. In some embodiments, the native oxide includes SiO$_2$.

At operation 503, a first spacer is deposited on the upper surface and sidewall surfaces of the gate stack with a first ALD process. In some embodiments, the ALD process can be performed at a temperature between about 600° C. and 650° C. (e.g., 630° C.) for a time period of three to four hours. In some embodiments, the first spacer is composed of four elements: silicon (Si), carbon (C), oxygen (O), and nitrogen (N). In some embodiments, the thickness of the first spacer is between 35 Å and 45 Å. In some embodiments, the dielectric constant (k-value) of the first spacer is between 4.8 and 5.2.

At operation 504, a second spacer is deposited over the first spacer using a second ALD process. In some embodiments, the second ALD process for depositing the second spacer is performed at a temperature between 75° C. and 85° C. for a period of time between 400 and 500 minutes. In some embodiments, the second spacer is composed of three elements: silicon (Si), carbon (C), and oxygen (O). In some embodiments, the thickness of the second spacer is between 35 Å and 45 Å.

At operation 505, the second spacer is treated with a He plasma. In some embodiments, the He plasma treatment uses a direct plasma process. In some embodiments, the He plasma process uses a plasma power between 1000 W and 2000 W (e.g., 1500 W). In some embodiments, the He plasma treatment step is performed at a temperature between 400° C. and 500° C. (e.g., about 450° C.). In some embodiments, the He plasma treatment step is performed for a time period of between 1 minute and 3 minutes (e.g., about 2 minutes).

At operation 506, the second spacer is treated with a N$_2$ gas under elevated temperature. In some embodiments, the treatment with a N$_2$ gas is a thermal annealing process performed at a temperature between 500° C. and 700° C. (e.g., about 600° C.) for a time period of between 25 minute and 35 minutes (e.g., about 30 minutes). In some embodiments, the thermal annealing step using the N$_2$ gas can be performed at atmospheric pressure. A person of ordinary skill in the art would understand that the thermal annealing step using the N$_2$ gas may be performed at a different temperature and for a different period of time than those disclosed in the present disclosure.

In some embodiments, after the treatment discussed in operations 405 and 406, the second spacer has a dielectric constant between about 3.8 and 3.9.

The spacer formed by methods in this disclosure provides a spacer with low k-value and reduced etch rates in both wet etch processes and dry etch processes. The low k-value helps reduce the resistance-capacitance (RC) delay of the devices and helps improve the speed of these devices. On the other hand, the reduction in both wet etch rates and dry etch rates helps to reduce the loss of the spacer during subsequent processes that involves wet etch and dry etch processes. Such reduction in loss of spacer helps preserve the shape of the spacer both vertically and horizontally, thus improving the device yield and reliability.

In some embodiments, a method of forming a spacer includes providing a structure having a gate stack. The gate stack includes an upper surface and sidewall surfaces. The gate stack further includes a gate dielectric layer, a conductive layer and a cap insulation layer. A first spacer is formed on the upper surface and the sidewall surface of the gate stack. A second spacer is formed on the first spacer. After formation, the second spacer is first treated with a plasma, then treated with a gas.

In some embodiments, a method of forming a spacer includes providing a structure having a gate stack. The gate stack includes an upper surface and sidewall surfaces. The gate stack further includes a gate dielectric layer, a conductive layer and a cap insulation layer. A first spacer is deposited on the upper surface and the sidewall surface of the gate stack using a first ALD process. A second spacer is deposited on the first spacer using a second ALD process. After deposition, the second spacer is first treated with a plasma, then treated with a gas.

In some embodiments, a method of forming a spacer includes providing a structure having a protruding structure. The protruding structure includes an upper surface and sidewall surfaces. A spacer is deposited with an ALD process on the upper surface and sidewall surfaces of the protruding structure. After deposition, the spacer is first treated with a He plasma, then annealed with a N$_2$ gas.

It is to be appreciated that the Detailed Description section, and not the Summary and Abstract sections, is intended to be used to interpret the claims. The Summary and Abstract sections may set forth one or more but not all exemplary embodiments of the present disclosure as contemplated by the inventor(s), and thus, are not intended to limit the present disclosure and the appended claims in any way.

The foregoing disclosure outlines features of several embodiments so that a person of ordinary skill in the art may better understand the aspects of the present disclosure. A person of ordinary skill in the art will appreciate that they may readily use the present disclosure as a basis for designing or modifying other processes and structures for carrying out the same purposes and/or achieving the same advantages of the embodiments introduced herein. A person of ordinary skill in the art will also realize that such equivalent constructions do not depart from the spirit and scope of the present disclosure, and that they may make various changes, substitutions, and alterations herein without departing from the spirit and scope of the present disclosure.

What is claimed is:

1. A method for forming a semiconductor device, the method comprising:
   forming a gate stack comprising an upper surface and a sidewall surface;
   forming a first spacer on the upper surface and the sidewall surface of the gate stack;
   forming a second spacer over the first spacer;
   treating the second spacer with a plasma at a first temperature for a first period of time;
   treating the second spacer with a gas at a second temperature for a second period of time; and
   replacing the gate stack with a metal gate stack, wherein the metal gate stack is formed over a fin active region.

2. The method of claim 1, wherein the forming the first spacer comprises depositing the first spacer with an atomic layer deposition (ALD) process.

3. The method of claim 1, wherein the first spacer comprises silicon (Si), oxygen (O), nitrogen (N), and carbon (C).

4. The method of claim 1, wherein the forming the second spacer comprises depositing the second spacer with an ALD process.

5. The method of claim 1, wherein the second spacer comprises silicon (Si), oxygen (O), and carbon (C).

6. The method of claim 1, wherein the second spacer has a dielectric constant less than about 4.0.

7. The method of claim 1, wherein the first spacer and the second spacer each has a thickness between about 35 Å and about 45 Å.

8. The method of claim 1, wherein the plasma comprises a helium (He) plasma.

9. The method of claim 1, wherein the gas comprises nitrogen ($N_2$) or hydrogen ($H_2$).

10. The method of claim 1, wherein the second temperature is higher than the first temperature.

11. The method of claim 1, wherein the gate stack comprises a metal layer and a dielectric layer.

12. The method of claim 1, wherein the treating the second spacer with the plasma comprises forming Si—O—Si—C cage-link bonds in the second spacer.

13. A method for forming a semiconductor device, the method comprising:

forming a gate stack comprising an upper surface and a sidewall surface;

depositing a first spacer with a first atomic layer deposition (ALD) process at a first temperature for a first period of time, wherein the first spacer covers the upper surface and the sidewall surface of the gate stack; and forming a second spacer over the first spacer, wherein the forming the second spacer comprises:

depositing the second spacer with a second ALD process at a second temperature for a second period of time;

treating the second spacer with a helium (He) plasma at a third temperature for a third period of time; and annealing the second spacer with a nitrogen ($N_2$) gas at a fourth temperature for a fourth period of time.

14. The method of claim 13, wherein the second spacer comprises silicon (Si), oxygen (O), and carbon (C).

15. The method of claim 13, wherein the second spacer has a dielectric constant less than about 4.0.

16. The method of claim 13, wherein the first spacer and the second spacer each has a thickness between about 35 Å and about 45 Å.

17. A method for forming a semiconductor device, the method comprising:

forming a fin with an upper surface and a sidewall surface;

depositing a first spacer to cover the upper surface and the sidewall surface of the fin;

depositing a second spacer over the first spacer;

treating the second spacer with a helium (He) plasma at a first temperature; and annealing the second spacer with a nitrogen ($N_2$) gas at a second temperature.

18. The method of claim 17, wherein the second spacer has a thickness between about 35 Å and about 45 Å and a dielectric constant less than about 4.0.

19. The method of claim 17, wherein the treating the second spacer with the He plasma comprises forming Si—O—Si—C cage-link bonds in the second spacer.

20. The method of claim 17, wherein the second spacer comprises silicon (Si), oxygen (O), and carbon (C).

* * * * *